US012652756B2

(12) United States Patent
Lu et al.

(10) Patent No.: US 12,652,756 B2
(45) Date of Patent: Jun. 9, 2026

(54) SUBSTRATE STRUCTURE

(71) Applicant: Subtron Technology Co., Ltd.,
Hsinchu County (TW)

(72) Inventors: Chung Ying Lu, Hsinchu County
(TW); Po-Wen Cheng, Hsinchu County
(TW)

(73) Assignee: Subtron Technology Co., Ltd.,
Hsinchu County (TW)

( * ) Notice: Subject to any disclaimer, the term of this
patent is extended or adjusted under 35
U.S.C. 154(b) by 269 days.

(21) Appl. No.: 18/490,746

(22) Filed: Oct. 19, 2023

(65) Prior Publication Data

US 2025/0089162 A1     Mar. 13, 2025

(30) Foreign Application Priority Data

Sep. 11, 2023    (TW) ................................. 112134485

(51) Int. Cl.
H05K 1/05          (2006.01)
H05K 1/02          (2006.01)
(52) U.S. Cl.
CPC ............. H05K 1/05 (2013.01); H05K 1/0204
(2013.01); *H05K 2201/09054* (2013.01)
(58) Field of Classification Search
CPC . H05K 1/05; H05K 1/021; H05K 2201/09054
See application file for complete search history.

(56) References Cited

U.S. PATENT DOCUMENTS

2007/0074900 A1     4/2007  Lee et al.
2008/0257590 A1     10/2008 Ho et al.

2009/0113705 A1*    5/2009  McKinley .............. H05K 1/021
                                                      29/830
2010/0006330 A1*    1/2010  Fu ........................... H01L 24/19
                                                      29/856

FOREIGN PATENT DOCUMENTS

CN      112563221      3/2021
CN      115799073      3/2023
CN      116013870      4/2023
TW      201021119      6/2010
TW      201232672      8/2012
TW      201343013      10/2013

OTHER PUBLICATIONS

"Office Action of Taiwan Counterpart Application", issued on Aug.
15, 2024, p. 1-p. 9.
"Office Action of Taiwan Counterpart Application", issued on Oct.
4, 2024, p. 1-p. 9.

* cited by examiner

*Primary Examiner* — Jeremy C Norris
(74) *Attorney, Agent, or Firm* — JCIPRNET

(57)                ABSTRACT

A substrate structure includes a substrate, an insulation
filling structure, a chip, a first circuit layer, a second circuit
layer and a conductive connector. The substrate has a first
surface and a second surface opposite to each other, wherein
the substrate is a thermally and electrically conductive
material. The insulation filling structure is disposed in the
substrate to separate the substrate into a plurality of regions
isolated from each other. The chip is disposed on and in
direct contact with the substrate. The first circuit layer is
disposed over the first surface of the substrate. The second
circuit layer is disposed over the second surface of the
substrate. The conductive connector penetrates through the
insulation filling material and is electrically connected with
the first circuit layer and the second circuit layer.

18 Claims, 7 Drawing Sheets

40

$$120 \begin{cases} 120{-}1 \\ 120{-}2 \end{cases}$$

$$130 \begin{cases} 130{-}1 \\ 130{-}2 \end{cases}$$

50

$500 \begin{cases} 500\text{-}1 \\ 500\text{-}2 \\ 500\text{-}3 \end{cases}$ $120 \begin{cases} 120\text{-}1 \\ 120\text{-}2 \end{cases}$ $130 \begin{cases} 130\text{-}1 \\ 130\text{-}2 \end{cases}$

SUBSTRATE STRUCTURE

CROSS-REFERENCE TO RELATED APPLICATION

This application claims the priority benefit of Taiwan application serial no. 112134485, filed on Sep. 11, 2023. The entirety of the above-mentioned patent application is hereby incorporated by reference herein and made a part of this specification.

BACKGROUND

Field of the Disclosure

The present disclosure relates to a structure, and in particular to a substrate structure.

Description of Related Art

Miniaturization of electronic devices is now a trend as science and technology continue to develop. In order to reduce the size of electronic devices, compact packaging of elements is required to achieve the purpose, and therefore the need for embedded chip substrates has increased accordingly. The existing embedded chip substrate uses an organic resin-impregnated glass fiber cloth material as the core board, and a groove is formed in the core board for placing the chip therein. However, as the power of chip increases, a relatively large amount of heat is generated in the substrate, causing the elements to overheat and affecting their performance. Therefore, how to improve the heat dissipation efficiency of the embedded chip substrate is currently a problem that needs to be improved.

SUMMARY OF THE DISCLOSURE

The present disclosure provides a substrate structure, which has a good supporting force and a heat dissipation effect, and allows effective utilization of space. In an embodiment of the disclosure, a substrate structure includes a substrate, an insulation filling structure, a chip, a first circuit layer, a second circuit layer and a conductive connector. The substrate has a first surface and a second surface opposite to each other, wherein the substrate is a thermally and electrically conductive material. The insulation filling structure is disposed in the substrate to separate the substrate into a plurality of regions isolated from each other. The chip is disposed on and in direct contact with the substrate. The first circuit layer is disposed over the first surface of the substrate. The second circuit layer is disposed over the second surface of the substrate. The conductive connector penetrates through the insulation filling structure and is electrically connected with the first circuit layer and the second circuit layer.

In an embodiment of the present disclosure, the upper surface of the insulation filling structure is substantially coplanar with the first surface of the substrate, and the lower surface of the insulation filling structure is substantially coplanar with the second surface of the substrate.

In an embodiment of the present disclosure, the insulation filling structure is located between the conductive connector and the substrate.

In an embodiment of the present disclosure, the substrate has a groove, and the chip is disposed in the groove.

In an embodiment of the present disclosure, the depth of the groove is greater than the thickness of the chip.

In an embodiment of the present disclosure, the substrate structure further includes a first adhesive layer, which is disposed between the substrate and the first circuit layer and filled in the groove.

In an embodiment of the present disclosure, the substrate structure further includes a first insulating layer disposed between the first surface of the substrate and the first circuit layer and having an opening, wherein the chip is disposed on the first surface of the substrate and located in the opening of the first insulating layer.

In an embodiment of the present disclosure, the substrate structure further includes a first adhesive layer disposed between the first insulating layer and the first circuit layer, and filled in the gap between the chip and the first insulating layer.

In an embodiment of the present disclosure, the material of the substrate includes copper.

In an embodiment of the present disclosure, the thickness of the substrate is between 70 μm and 300 μm, and the thicknesses of the first circuit layer and the second circuit layer are between 15 μm and 25 μm respectively.

A substrate structure according to another embodiment of the present disclosure includes a substrate, a chip, a first circuit layer and a second circuit layer. The substrate has a first surface and a second surface opposite to each other and has a through groove penetrating the substrate, wherein the substrate is a copper plate. The chip is placed in the through groove. The first circuit layer is disposed over the first surface of the substrate and is electrically connected to the chip through the first conductive via. The second circuit layer is disposed over the second surface of the substrate.

In an embodiment of the present disclosure, the chip is in direct contact with the second circuit layer.

In an embodiment of the present disclosure, the chip is electrically connected to the second circuit layer through a second conductive via.

In an embodiment of the present disclosure, the substrate structure further includes an insulation filling structure, which is disposed in the through groove and located between the substrate and the chip.

In an embodiment of the present disclosure, the substrate structure further includes an insulation filling structure embedded in the substrate to separate the substrate into multiple regions isolated from each other.

In an embodiment of the present disclosure, part of the first circuit layer is electrically connected to the second circuit layer through part of the substrate.

In an embodiment of the present disclosure, the substrate structure further includes a conductive connector that penetrates through the insulation filling structure and is electrically connected to the first circuit layer and the second circuit layer.

In an embodiment of the present disclosure, the substrate structure further includes a first insulating layer disposed between the first surface of the substrate and the first circuit layer.

In an embodiment of the present disclosure, the first insulating layer is filled in the through groove.

In an embodiment of the present disclosure, the substrate structure further includes a second insulating layer, which is disposed between the second surface of the substrate and the second circuit layer and is in contact with the first insulating layer.

Based on the above, the substrate structure of the present disclosure adopts a thermally and electrically conductive material as a substrate and has a chip disposed in the substrate or in contact with the substrate. Therefore, the present disclosure is able to provide a good supporting force whiling having a good heat dissipation effect, and utilizes space effectively.

DESCRIPTION OF EMBODIMENTS

Figure 1:
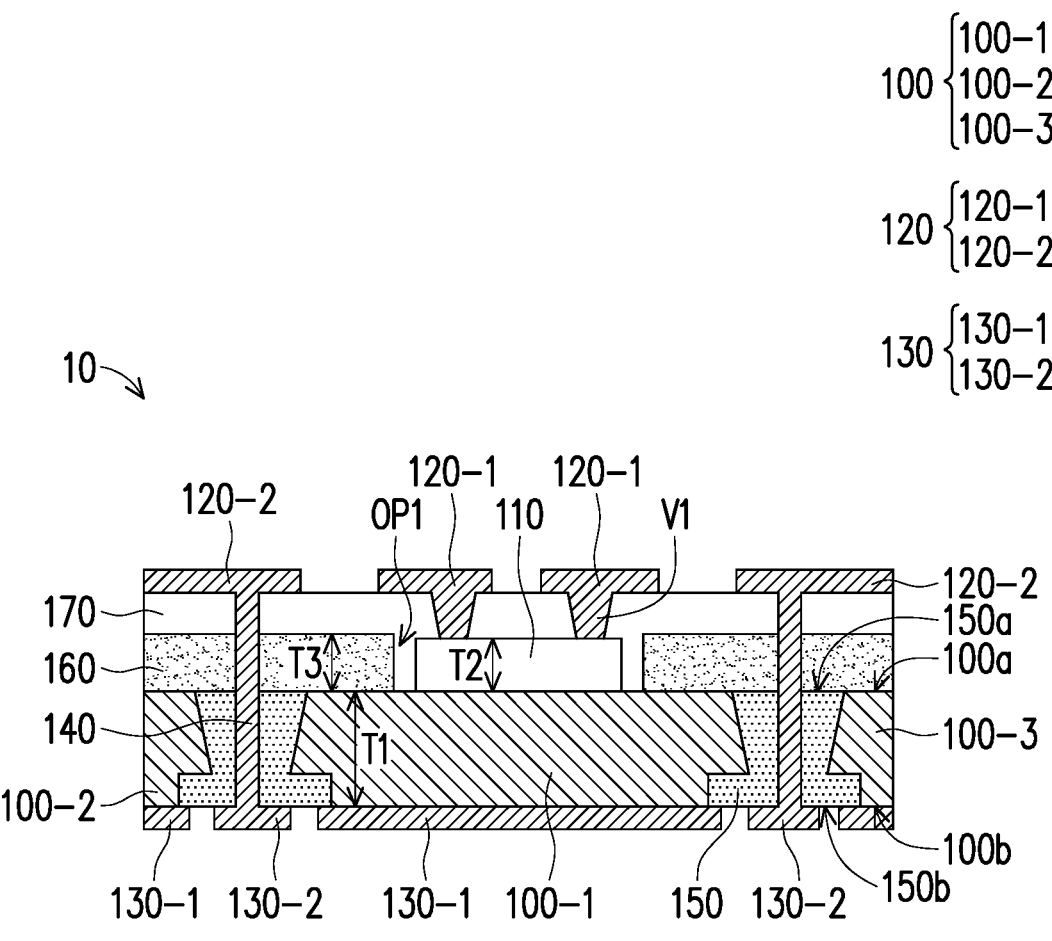
FIG. 1 is a schematic cross-sectional view of a substrate structure according to an embodiment of the present disclosure.

The directional terms mentioned in this disclosure, such as "upper", "lower", "front", "back", "left", "right", etc., are only for reference to the directions of the accompanying drawings. Accordingly, the directional terms used are illustrative and not limiting of the disclosure.

In the drawings, each figure illustrates the general features of methods, structures, and/or materials used in particular embodiments. However, these drawings should not be interpreted as defining or limiting the scope or nature encompassed by these embodiments. For example, the relative sizes, thicknesses, and locations of various layers, regions, and/or structures may be reduced or exaggerated for clarity.

In the following embodiments, the same or similar elements will be denoted by the same or similar numbers, and repeated descriptions thereof will be omitted. In addition, features in different embodiments can be combined with each other if there is no conflict between them, and simple equivalent changes and modifications made in accordance with this specification or the scope of the disclosure are still within the scope of this disclosure.

It will be understood that, although the terms "first," "second," "third," etc. may be used herein to describe various elements, components, regions, layers and/or sections, these elements, components, regions, and/or sections shall not be limited by these terms. These terms are only used to distinguish one element, component, region, layer or section from another element, component, region, layer or section. Thus, a first element, component, region, layer or section discussed below could be described as a second element, component, region, layer or section without departing from the teachings herein.

FIG. 1 is a schematic cross-sectional view of a substrate structure according to an embodiment of the present disclosure.

Please refer to FIG. 1, the substrate structure 10 includes a base 100, a chip 110, a first circuit layer 120, a second circuit layer 130, a conductive connector 140 and an insulation filling structure 150. The substrate 100 has a first surface 100*a* and a second surface 100*b* opposite to each other. The insulation filling structure 150 is disposed in the substrate 100 to separate the substrate 100 into a plurality of regions isolated from each other. The chip 110 is disposed on the substrate 100 and is in direct contact with the substrate 100. The first circuit layer 120 is disposed over the first surface 100*a* of the substrate 100. The second circuit layer 130 is disposed over the second surface 100*b* of the substrate 100. The conductive connector 140 penetrates through the insulation filling structure 150 and is electrically connected to the first circuit layer 120 and the second circuit layer 130.

The substrate 100 is a thermally and electrically conductive material, for example, which may be copper, aluminum or other suitable metal materials. In some embodiments, the substrate 100 is a copper plate. In some embodiments, the thickness T1 of the substrate 100 is between 70 μm and 300 μm to serve as a support for the substrate structure 10, but the present disclosure is not limited thereto.

In some embodiments, the substrate 100 may include first, second, and third regions 100-1, 100-2, and 100-3 separated from each other by an insulation filling structure 150. Therefore, in the application of the packaging process, the first region 100-1, the second region 100-2 and the third region 100-3 may provide different packaging elements or heating elements for heat dissipation or electrical conduction. It should be understood that FIG. 1 only schematically depicts the substrate 100 as being divided into three regions, but the illustration is not intended to limit the present disclosure. The number of division of the substrate 100 may be adjusted according to actual needs.

The insulation filling structure 150 is located between the substrate 100 and the conductive connector 140 to electrically isolate the substrate 100 from the conductive connector 140. The material of the insulation filling structure 150 may include, for example, organic materials or inorganic materials. Organic materials include, for example, epoxy resin, polyester resin, polyimide, and other organic materials; inorganic materials include, for example, ceramics, silicon, silicon carbide, and other inorganic materials, but the disclosure is not limited thereto.

In some embodiments, the upper surface 150*a* of the insulation filling structure 150 is substantially coplanar with the first surface 100*a* of the substrate 100, and the lower surface 150*b* of the insulation filling structure 150 is substantially coplanar with the second surface 100*b* of the substrate 100.

In some embodiments, the cross-sectional shape of the insulation filling structure 150 may be a T shape, but the present disclosure is not limited thereto. In other embodiments, the cross-sectional shape of the insulation filling structure 110 may be a trapezoidal shape, a rectangular shape, or other shapes.

In some embodiments, the first circuit layer 120 may include a first circuit portion 120-1 and a second circuit portion 120-2. The first circuit portion 120-1 may be electrically connected to the chip 110 through the conductive via V1, and the second circuit portion 120-2 may be in direct contact with the conductive connector 140. In some embodiments, the first circuit portion 120-1 and the second circuit portion 120-2 may be externally connected as conductive pads, but the disclosure is not limited thereto.

In some embodiments, part of the second circuit layer 130 may be in direct contact with the second surface 100*b* of the substrate 100, but the present disclosure is not limited thereto. Specifically, the second circuit layer 130 may include a third circuit portion 130-1 and a fourth circuit portion 130-2. The third circuit portion 130-1 may be in direct contact with the second surface 100b of the substrate 100, and the fourth circuit portion 130-2 may be in direct contact with the conductive connector 140 and be disposed on the lower surface 150b of the insulation filling structure 150. In some embodiments, the chip 110 may be electrically connected to the third circuit portion 130-1 through the substrate 100-1, so the chip 110 may also be externally connected through the third circuit portion 130-1. In some embodiments, the third circuit portion 130-1 and the fourth circuit portion 130-2 may be externally connected as conductive pads, but the disclosure is not limited thereto.

In some embodiments, the first circuit layer 120 and the second circuit layer 130 may be thin circuits, and their thicknesses may be between 15 μm and 25 μm respectively, so that the thin circuits may be used with different packaging elements or heating elements for layout design in the application of the packaging process, thereby improving the application flexibility of the substrate structure 10.

The first circuit layer 120, the second circuit layer 130, the conductive via V1 and the conductive connector 140 may be made of metal, such as copper, gold, silver, aluminum, etc. In a preferred embodiment, the material of the first circuit layer 120, the second circuit layer 130, the conductive via V1 and the conductive connector 140 is copper.

In some embodiments, the material of the first circuit layer 120, the second circuit layer 130, the conductive via V1 and the conductive connector 140 may be the same as the material of the substrate 100, but the present disclosure is not limited thereto. In other embodiments, the material of the first circuit layer 120, the second circuit layer 130, the conductive via V1 and the conductive connector 140 may be different from the material of the substrate 100.

FIG. 1 only schematically illustrates the first circuit layer 120 and the second circuit layer 130, but this is not intended to limit the present disclosure. The layout design of the first circuit layer 120 and the second circuit layer 130 may be adjusted according to actual needs. For example, part of the first circuit layer 120 and/or part of the second circuit layer 130 may be used as a signal conduction path between elements, and another part of the first circuit layer 120 and/or another part of the second circuit layer 130 may serve as a heat dissipation path.

In this embodiment, the substrate structure 10 further includes a first insulating layer 160 and a first adhesive layer 170.

The first insulating layer 160 is disposed between the first surface 100a of the substrate 100 and the first circuit layer 120 and has an opening OP1. The chip 110 is located in the opening OP1 of the first insulating layer 160 and is disposed on the first surface 100a of the substrate 100 and in direct contact with the first surface 100a. In this way, the heat generated by the chip 110 may be in direct contact with the substrate 100, and the heat dissipation efficiency may be improved.

In some embodiments, the material of the first insulating layer 160 may include polypropylene resin, epoxy resin, phenolic resin or other suitable insulating materials. In some embodiments, the first insulating layer 160 is film.

In some embodiments, the thickness T3 of the first insulating layer 160 is slightly greater than the thickness T2 of the chip 110 to reduce the possibility of damaging the chip 110 during the lamination process.

The first adhesive layer 170 is disposed between the substrate 100 and the first circuit layer 120 and between the first insulating layer 160 and the first circuit layer 120, and is filled into the opening OP1, so that the first adhesive layer 170 is filled in the gap between the chip 110 and the first insulating layer 160.

In some embodiments, the first adhesive layer 170 may be an insulating material exhibiting reduced moisture absorption, low overflowing, good heat resistance, and favorable adhesion. In some embodiments, the first adhesive layer 170 and the first insulating layer 160 are made of different materials.

In some embodiments, the conductive via V1 is located in the first adhesive layer 170.

In some embodiments, the conductive connector 140 may further penetrate through the first insulating layer 160 and the first adhesive layer 170 to be connected to the first circuit layer 120. That is to say, the conductive connector 140 is able to conduct both sides of the substrate structure 10, so the packaging elements or heating elements (not shown) in the application of the packaging process may be directly conducted through the conductive connector 140, thereby omitting additional layout design.

Figure 2:
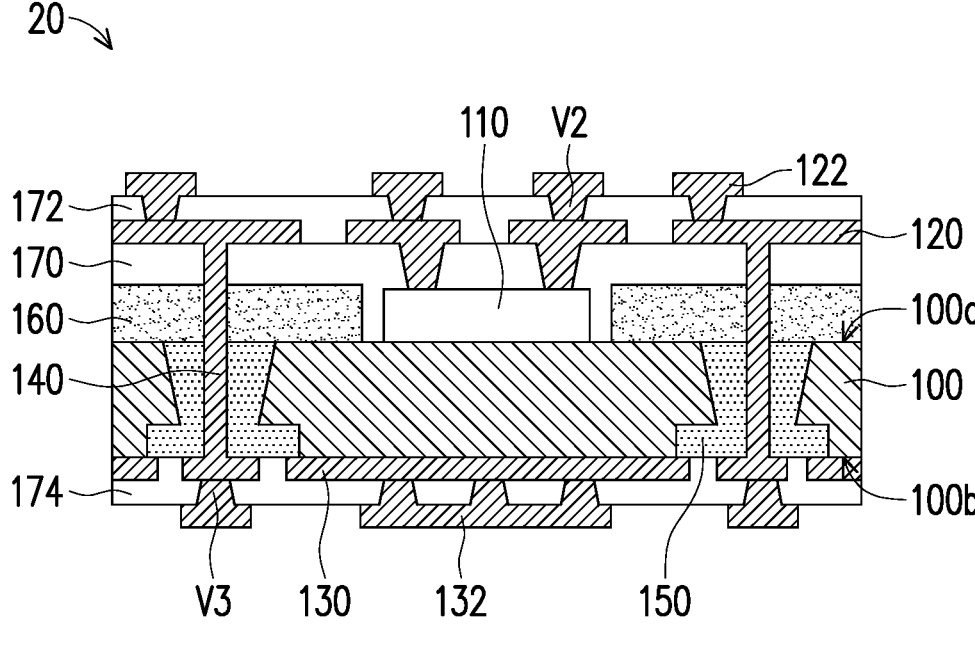
FIG. 2 is a schematic cross-sectional view of a substrate structure according to another embodiment of the present disclosure.

FIG. 2 is a schematic cross-sectional view of a substrate structure according to another embodiment of the present disclosure. It should be noted here that the embodiment of FIG. 2 adopts the reference numbers and part of the content of the embodiment of FIG. 1, where the same or similar numbers are used to denote the same or similar elements, and the description of the same technical content is omitted. For descriptions of omitted parts, reference may be made to the foregoing embodiments and will not be described again here.

Please refer to FIG. 2. The main difference between the substrate structure 20 of FIG. 2 and the substrate structure 10 of FIG. 1 is that the substrate structure 20 further includes a third circuit layer 122, a fourth circuit layer 132, a second adhesive layer 172 and a third adhesive layer 174. The second adhesive layer 172 covers the first circuit layer 120 and the first adhesive layer 170. The third circuit layer 122 is disposed on the second adhesive layer 172 and is connected to the corresponding first circuit layer 120 through the conductive via V2, wherein the conductive via V2 is located in the second adhesive layer 172. On the other hand, the third adhesive layer 174 covers the second circuit layer 130, and the fourth circuit layer 132 is disposed on the third adhesive layer 174 and connected to the corresponding second circuit layer 130 through the conductive via V3, wherein the conductive via V3 is located in the third adhesive layer 174. The material of the second adhesive layer 172 and the third adhesive layer 174 may be similar to the material of the first adhesive layer 170. The material of the third circuit layer 122, the fourth circuit layer 132, the conductive via V2 and the conductive via V3 may be similar to the material of the first circuit layer 110. In some embodiments, the thicknesses of the third circuit layer 122 and the fourth circuit layer 132 may be between 15 μm and 25 μm respectively.

FIG. 2 only schematically illustrates that two circuit layers are respectively provided on the first surface 100a and the second surface 100b of the substrate 100, but the present disclosure is not limited thereto. The number of circuit layers on the first surface 100a and the second surface 100b of the substrate 100 may be the same or different, and the number of circuit layers and adhesive layers stacked on the substrate 100 may be adjusted according to actual needs.

The first surface 100a and the second surface 100b of the substrate 100 include multiple circuit layers, so that the substrate structure 20 has multiple and flexible layout designs. Therefore, when being applied in the packing process, the substrate structure 20 may be adopted together with the packaging element or heating element for designing a signal conducting path and a heat dissipation path.

Figure 3:
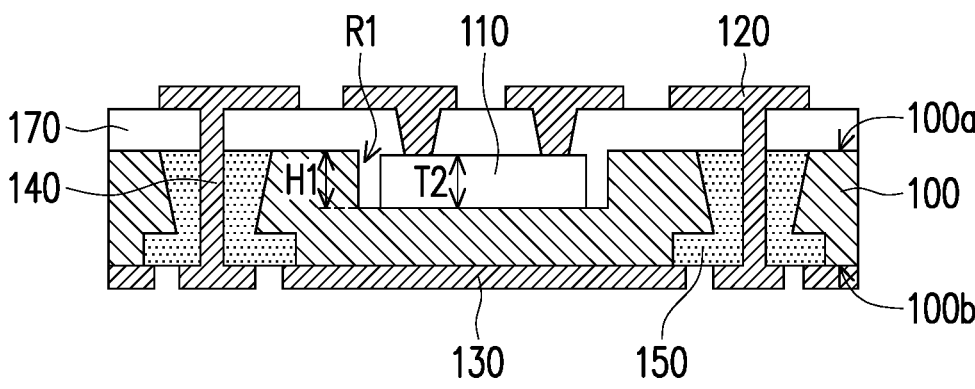
FIG. 3 is a schematic cross-sectional view of a substrate structure according to yet another embodiment of the present disclosure.

FIG. 3 is a schematic cross-sectional view of a substrate structure according to yet another embodiment of the present disclosure. It should be noted here that the embodiment of FIG. 3 adopts the reference numbers and part of the content of the embodiment of FIG. 1, where the same or similar numbers are used to denote the same or similar elements, and the description of the same technical content is omitted. For descriptions of omitted parts, reference may be made to the foregoing embodiments and will not be described again here.

Please refer to FIG. 3. The main difference between the substrate structure 30 of FIG. 3 and the substrate structure 10 of FIG. 1 is that the substrate structure 30 includes a substrate 100, a chip 110, a first circuit layer 120, a second circuit layer 130, a conductive connector 140, an insulation filling structure 150 and a first adhesive layer 170. The substrate 100 has a groove R1, and the chip 110 is disposed in the groove R1. The first adhesive layer 170 is disposed between the first surface 100$a$ of the substrate 100 and the first circuit layer 120, and is filled in the groove R1, so that the first adhesive layer 170 fills the gap between the chip 110 and the substrate 100.

In some embodiments, the depth H1 of the groove R1 is greater than the thickness T2 of the chip 110, so as to reduce the possibility of damaging the chip 110 during the lamination process.

In some embodiments, the chip 110 is in direct contact with the bottom surface of the groove R1, so that the heat generated by the chip 110 may be in direct contact with the substrate 100, and the heat dissipation efficiency may be improved.

The substrate structure 30 may effectively utilize space and improve heat dissipation efficiency by disposing the chip 110 in the groove R1 of the substrate 100 to be in direct contact with the substrate 100.

Figure 4:
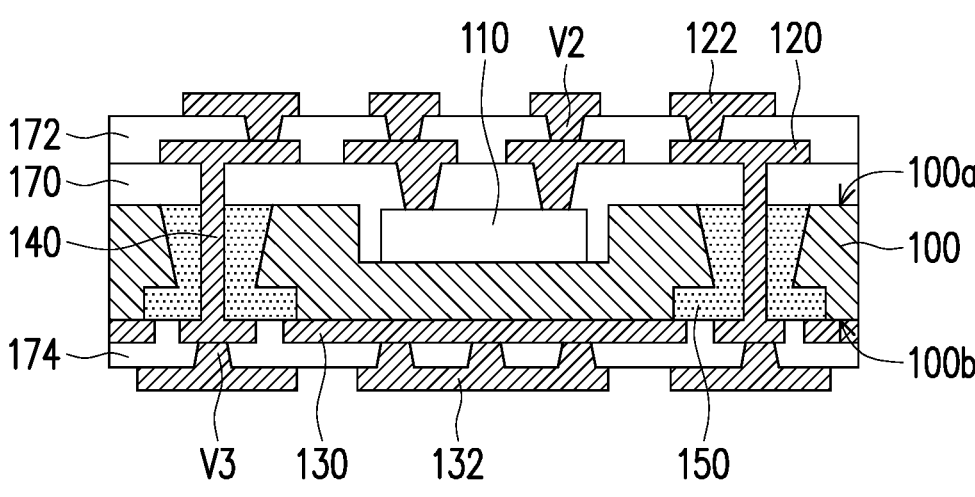
FIG. 4 is a schematic cross-sectional view of a substrate structure according to still another embodiment of the present disclosure.

FIG. 4 is a schematic cross-sectional view of a substrate structure according to still another embodiment of the present disclosure. It should be noted here that the embodiment of FIG. 4 adopts the reference numbers and part of the content of the embodiment of FIG. 3, where the same or similar numbers are used to denote the same or similar elements, and the description of the same technical content is omitted. For descriptions of omitted parts, reference may be made to the foregoing embodiments and will not be described again here.

Please refer to FIG. 4. The main difference between the substrate structure 40 of FIG. 4 and the substrate structure 30 of FIG. 3 is that the substrate structure 40 further includes a third circuit layer 122, a fourth circuit layer 132, a second adhesive layer 172 and a third adhesive layer 174. The second adhesive layer 172 covers the first circuit layer 120 and the first adhesive layer 170. The third circuit layer 122 is disposed on the second adhesive layer 172 and is connected to the corresponding first circuit layer 120 through the conductive via V2, wherein the conductive via V2 is located in the second adhesive layer 172. On the other hand, the third adhesive layer 174 covers the second circuit layer 130, and the fourth circuit layer 132 is disposed on the third adhesive layer 174 and connected to the corresponding second circuit layer 130 through the conductive via V3, wherein the conductive via V3 is located in the third adhesive layer 174.

FIG. 4 only schematically shows that two circuit layers are respectively provided on the first surface 100$a$ and the second surface 100$b$ of the substrate 100, but this is not intended to limit the present disclosure. The number of circuit layers on the first surface 100$a$ and the second surface 100$b$ of the substrate 100 may be the same or different, and the number of circuit layers and adhesive layers stacked on the substrate 100 may be adjusted according to actual needs.

The first surface 100$a$ and the second surface 100$b$ of the substrate 100 include multiple circuit layers, so that the substrate structure 40 has multiple and flexible layout designs. Therefore, when being applied in the packing process, the substrate structure 40 may be adopted together with the packaging element or heating element for designing a signal conducting path and a heat dissipation path.

Figure 5:
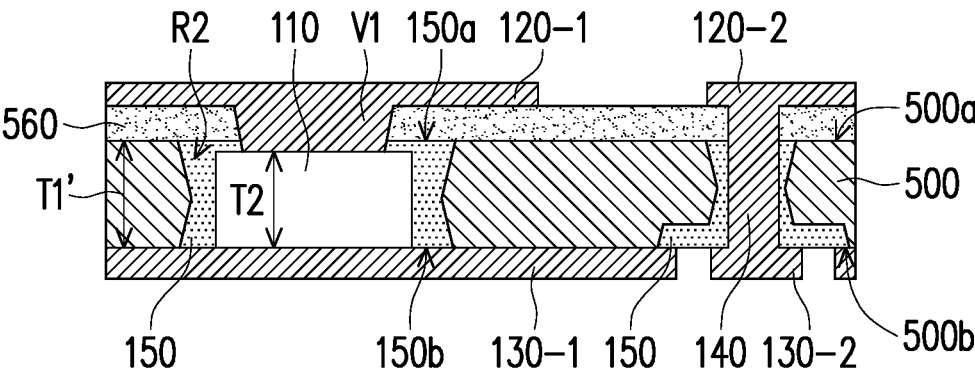
FIG. 5 is a schematic cross-sectional view of a substrate structure according to yet another embodiment of the present disclosure.

FIG. 5 is a schematic cross-sectional view of a substrate structure according to yet another embodiment of the present disclosure. It should be noted here that the embodiment of FIG. 5 adopts the reference numbers and part of the content of the embodiment of FIG. 1, where the same or similar numbers are used to denote the same or similar elements, and the description of the same technical content is omitted. For descriptions of omitted parts, reference may be made to the foregoing embodiments and will not be described again here.

Please refer to FIG. 5. The main difference between the substrate structure 50 of FIG. 5 and the substrate structure 10 of FIG. 1 is that the substrate structure 50 includes a substrate 500, a chip 110, a first circuit layer 120 and a second circuit layer 130. The substrate 500 has a first surface 500$a$ and a second surface 500$b$ opposite to each other, and has a through groove R2 penetrating through the substrate 500. The chip 110 is disposed in the through groove R2. The first circuit layer 120 is disposed over the first surface 500$a$ of the substrate 500 and is electrically connected to the chip 110 through the conductive via V1. The second circuit layer 130 is disposed over the second surface 500$b$ of the substrate 500. The material of the substrate 500 may be similar to the material of the aforementioned substrate 100. For example, the substrate 500 may be a copper plate.

In some embodiments, the substrate structure 50 further includes an insulation filling structure 150, which is disposed in the through groove R2 and located between the substrate 500 and the chip 110. In some embodiments, the upper surface 150$a$ of the insulation filling structure 150 is substantially coplanar with the first surface 500$a$ of the substrate 500, and the lower surface 150$b$ of the insulation filling structure 150 is substantially coplanar with the second surface 500$b$ of the substrate 500.

In some embodiments, the thickness T1' of the substrate 500 is greater than the thickness T2 of the chip 110, so as to reduce the possibility of damaging the chip 110 during the lamination process.

In some embodiments, the substrate structure 50 further includes a first insulating layer 560, which is disposed between the first surface 500$a$ of the substrate 500 and the first circuit layer 120, wherein the conductive via V1 is located in the first insulating layer 560. The material of the first insulating layer 560 may be similar to the material of the first insulating layer 160, but the present disclosure is not limited thereto. In other embodiments, the first adhesive layer 170 may also be used as the first insulating layer 560.

In some embodiments, the substrate structure 50 further includes a conductive connector 140 that penetrates through the substrate 500 and the first insulating layer 560 to be electrically connected to the first circuit layer 120 and the second circuit layer 130. In some embodiments, the insulation filling structure 150 is also located between the conductive connector 140 and the substrate 500 to electrically isolate the conductive connector 140 from the substrate 500.

In some embodiments, the insulation filling structure 150 may divide the substrate 500 into multiple regions that are isolated from each other.

In some embodiments, the first circuit layer 120 may include a first circuit portion 120-1 and a second circuit portion 120-2. The first circuit portion 120-1 may be electrically connected to the chip 110 through the conductive via V1, and the second circuit portion 120-2 may be in direct contact with the conductive connector 140. In some embodiments, the first circuit portion 120-1 and the second circuit portion 120-2 may be externally connected as conductive pads, but the disclosure is not limited thereto.

In some embodiments, part of the second circuit layer 130 may be in direct contact with the second surface 100b of the substrate 100, but the present disclosure is not limited thereto. Specifically, the second circuit layer 130 may include a third circuit portion 130-1 and a fourth circuit portion 130-2. The third circuit portion 130-1 may be in direct contact with the second surface 500b of the substrate 500, and the fourth circuit portion 130-2 may be in direct contact with the conductive connector 140 and disposed on the lower surface 150b of the insulation filling structure 150. In some embodiments, the third circuit portion 130-1 is further in direct contact with the chip 110. In other words, the heat generated by the chip 110 may be dissipated through the second circuit layer 130. In addition, the chip 110 may also be electrically connected to the third circuit portion 130-1, so the chip 110 may also be externally connected through the third circuit portion 130-1.

FIG. 5 only schematically shows that a circuit layer is provided on the first surface 500a and the second surface 500b of the substrate 500 respectively, but this is not intended to limit the present disclosure. The circuit layer on the first surface 500a and the second surface 500b of the substrate 500 may have multiple layers according to actual needs, and the number of circuit layers on the first surface 500a and the second surface 500b of the substrate 500 may be the same or different.

By disposing the chip 110 in the through groove R2 of the substrate 500 to be in direct contact with the second circuit layer 130, the substrate structure 50 may effectively utilize space and improve heat dissipation efficiency.

Figure 6:
FIG. 6 is a schematic cross-sectional view of a substrate structure according to still another embodiment of the present disclosure.
Figure 6:
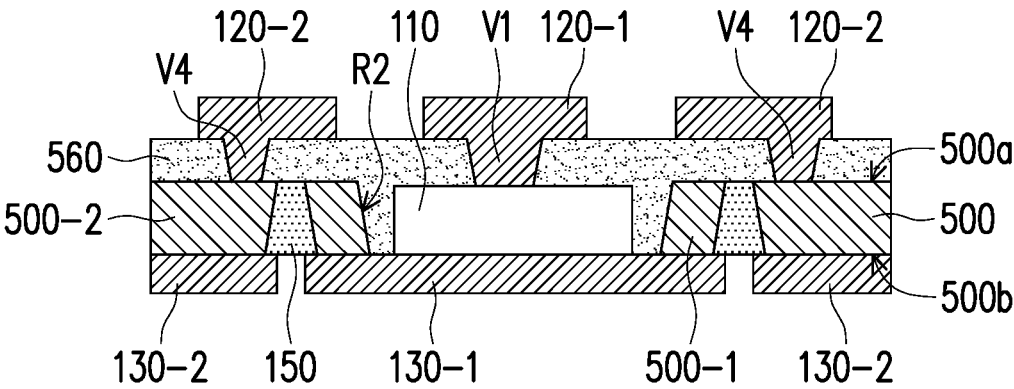

FIG. 6 is a schematic cross-sectional view of a substrate structure according to still another embodiment of the present disclosure. It should be noted here that the embodiment of FIG. 6 adopts the reference numbers and part of the content of the embodiment of FIG. 5, where the same or similar numbers are used to denote the same or similar elements, and the description of the same technical content is omitted. For descriptions of omitted parts, reference may be made to the foregoing embodiments and will not be described again here.

Please refer to FIG. 6. The main difference between the substrate structure 60 of FIG. 6 and the substrate structure 50 of FIG. 5 is that the first insulating layer 560 of the substrate structure 60 is filled in the through groove R2, so that the first insulating layer 560 is located between the substrate 500 and the chip 110. The insulation filling structure 150 is embedded in the substrate 500 to divide the substrate 500 into multiple regions isolated from each other, such as a first region 500-1, a second region 500-2, and a third region 500-3. In FIG. 6, the through groove R2 is located in the first region 500-1 of the substrate 500, but the disclosure is not limited thereto.

In some embodiments, the first circuit layer 120 may include a first circuit portion 120-1 and a second circuit portion 120-2. The first circuit portion 120-1 may be electrically connected to the chip 110 through the conductive via V1, and the second circuit portion 120-2 may be electrically connected to part of the substrate 500 (such as the first region 500-1 or the third region 500-3) through the conductive via V4. In some embodiments, the first circuit portion 120-1 and the second circuit portion 120-2 may be externally connected as conductive pads, but the disclosure is not limited thereto.

In some embodiments, part of the second circuit layer 130 may be in direct contact with the second surface 500b of the substrate 500, but the present disclosure is not limited thereto. Specifically, the second circuit layer 130 may include a third circuit portion 130-1 and a fourth circuit portion 130-2. The third circuit portion 130-1 may be in direct contact with the first region 500-1 of the substrate 500 and the chip 110. In other words, the heat generated by the chip 110 may be dissipated through the second circuit layer 130. In addition, the chip 110 may also be electrically connected to the third circuit portion 130-1, so the chip 110 may also be externally connected through the third circuit portion 130-1. The fourth circuit portion 130-2 may be in direct contact with the second surface 500b of part of the substrate 500 (e.g., the first region 500-1 or the third region 500-3). In some embodiments, the third circuit portion 130-1 and the fourth circuit portion 130-2 may be externally connected as conductive pads, but the disclosure is not limited thereto.

Since the second circuit portion 120-2, part of the substrate 500 (such as the first region 500-1 or the third region 500-3) and the third circuit portion 130-1 are electrically connected to each other, the entirety thereof may be regarded as a conductive connector that conducts both sides of the substrate structure 60. Therefore, in the application of the packaging process, the packaging element or the heating element (not shown) may be directly conducted through the conductive connector composed of the second circuit portion 120-2, part of the substrate 500 and the third circuit portion 130-1, thereby omitting additional layout design.

FIG. 6 only schematically shows that a circuit layer is provided on the first surface 500a and the second surface 500b of the substrate 500 respectively, but this is not intended to limit the present disclosure. The circuit layer on the first surface 500a and the second surface 500b of the substrate 500 may have multiple layers according to actual needs, and the number of circuit layers on the first surface 500a and the second surface 500b of the substrate 500 may be the same or different.

FIG. 6 only schematically illustrates the substrate 500 being divided into three regions with a chip embedded therein, but this is not intended to limit the present disclosure. The substrate 500 may adjust the division of substrate and the number of embedded chips according to actual needs through the design of through grooves or insulation filling structures.

Figure 7:
FIG. 7 is a schematic cross-sectional view of a substrate structure according to yet another embodiment of the present disclosure.
Figure 7:
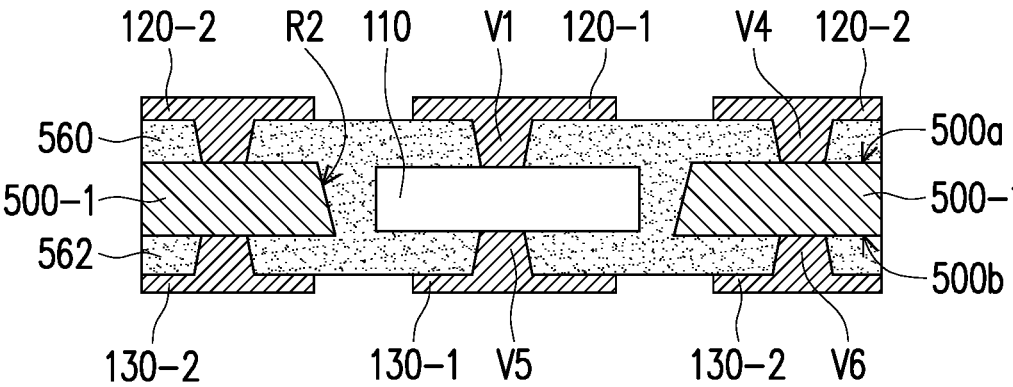

FIG. 7 is a schematic cross-sectional view of a substrate structure according to yet another embodiment of the present disclosure. It should be noted here that the embodiment of FIG. 7 adopts the reference numbers and part of the content of the embodiment of FIG. 6, where the same or similar numbers are used to denote the same or similar elements, and the description of the same technical content is omitted. For descriptions of omitted parts, reference may be made to the foregoing embodiments and will not be described again here.

Please refer to FIG. 7. The main difference between the substrate structure 70 of FIG. 7 and the substrate structure 60 of FIG. 6 is that the substrate structure 70 includes a substrate 500, a chip 110, a first circuit layer 120, a second circuit layer 130, a first insulating layer 560 and a second insulating layer 562. The substrate 500 has a first surface 500a and a second surface 500b opposite to each other, and has a through groove R2 penetrating through the substrate 500. The chip 110 is disposed in the through groove R2. The first circuit layer 120 is disposed over the first surface 500a of the substrate 500 and is electrically connected to the chip 110 through the conductive via V1. The second circuit layer 130 is disposed over the second surface 500b of the substrate 500 and is electrically connected to the chip 110 through the conductive via V5. The first insulating layer 560 is disposed between the first surface 500a of the substrate 500 and the first circuit layer 120. The second insulating layer 562 is disposed between the second surface 500b of the substrate 500 and the second circuit layer 130 and is in contact with the first insulating layer 560.

In some embodiments, the material of the second insulating layer 562 may be the same as or similar to the material of the first insulating layer 560.

In some embodiments, the first insulating layer 560 and/or the second insulating layer 562 are filled in the through groove R2, so that part of the first insulating layer 560 and/or part of the second insulating layer 562 is located between the chip 110 and the substrate 500 to fix the chip 110 in the through groove R2.

In some embodiments, the first circuit layer 120 may include a first circuit portion 120-1 and a second circuit portion 120-2. The first circuit portion 120-1 may be electrically connected to the chip 110 through the conductive via V1, and the second circuit portion 120-2 may be electrically connected to part of the substrate 500 through the conductive via V4. In some embodiments, the first circuit portion 120-1 and the second circuit portion 120-2 may be externally connected as conductive pads, but the disclosure is not limited thereto.

In some embodiments, the second circuit layer 130 may include a third circuit portion 130-1 and a fourth circuit portion 130-2. The third circuit portion 130-1 may be electrically connected to the chip 110 through the conductive via V5, and the fourth circuit portion 130-2 may be electrically connected to part of the substrate 500 through the conductive via V6. Therefore, the third circuit portion 130-1 and the fourth circuit portion 130-2 may be externally connected as conductive pads, but the disclosure is not limited thereto. Since the second circuit portion 130-2, part of the substrate 500 and the fourth circuit portion 130-2 are electrically connected to each other, the entirety thereof may be regarded as a conductive connector that conducts both sides of the substrate structure 70.

In some embodiments, the substrate 500 may include a first region 500-1 and a second region 500-2 separated from each other by a first insulating layer 560 and/or a second insulating layer 562. In this way, in the application of the packaging process, multiple packaging elements or heating elements may be provided for heat dissipation or layout design.

FIG. 7 only schematically illustrates the substrate 500 being divided into two regions with a chip embedded therein, but this is not intended to limit the present disclosure. The substrate 500 may adjust the division of substrate and the number of embedded chips according to actual needs through the design of through grooves or the insulation filling structure. In addition, FIG. 7 schematically illustrates that a circuit layer is provided on the first surface 500a and the second surface 500b of the substrate 500 respectively, but this is not intended to limit the present disclosure. The circuit layer on the first surface 500a and the second surface 500b of the substrate 500 may have multiple layers according to actual needs, and the number of circuit layers located on the first surface 500a and the second surface 500b of the substrate 500 may be the same or different.

To sum up, the substrate structure of the present disclosure adopts a thermally and electrically conductive material as the substrate and has a chip disposed in the substrate or in contact with the substrate. In this way, the disclosure is able to provide a good supporting force and a good heat dissipation effect, and make effective use of space so that the overall thickness of the substrate structure is between approximately 300 μm and 1200 μm.

Although the present disclosure has been disclosed in the above embodiments, it is not intended to limit the present disclosure. Anyone with ordinary knowledge in the technical field can make some modifications and changes without departing from the spirit and scope of the present disclosure, so the protection scope of the present disclosure shall be defined by the appended claims.

What is claimed is:

1. A substrate structure, comprising:
   a substrate, having a first surface and a second surface opposite to each other, wherein the substrate is a thermally and electrically conductive material;
   an insulation filling structure, disposed in the substrate to divide the substrate into a plurality of regions isolated from each other;
   a chip, disposed on the substrate and in direct contact with the substrate;
   a first circuit layer, disposed over the first surface of the substrate;
   a second circuit layer, disposed over the second surface of the substrate; and
   a conductive connector, penetrating through the insulation filling structure and electrically connected with the first circuit layer and the second circuit layer, wherein a thickness of the substrate is between 70 μm and 300 μm, and thicknesses of the first circuit layer and the second circuit layer are between 15 μm and 25 μm respectively.

2. The substrate structure according to claim 1, wherein an upper surface of the insulation filling structure is substantially coplanar with the first surface of the substrate, and a lower surface of the insulation filling structure is substantially coplanar with the second surface of the substrate.

3. The substrate structure according to claim 1, wherein the insulation filling structure is located between the conductive connector and the substrate.

4. The substrate structure according to claim 1, wherein the substrate has a groove, and the chip is disposed in the groove.

5. The substrate structure according to claim 4, wherein a depth of the groove is greater than a thickness of the chip.

6. The substrate structure according to claim 4, further comprising:
   a first adhesive layer, disposed between the substrate and the first circuit layer and filled in the groove.

7. The substrate structure according to claim 1, further comprising:
   a first insulating layer, disposed between the first surface of the substrate and the first circuit layer and having an opening, wherein the chip is disposed on the first surface of the substrate and located in the opening of the first insulating layer.

8. The substrate structure according to claim 7, further comprising:

a first adhesive layer, disposed between the first insulating layer and the first circuit layer, and filled in a gap between the chip and the first insulating layer.

9. The substrate structure according to claim 1, wherein the material of the substrate comprises copper.

10. A substrate structure, comprising:

a substrate, having a first surface and a second surface opposite to each other and having a through groove penetrating the substrate, wherein the substrate is a copper plate;

a chip, disposed in the through groove;

a first circuit layer, disposed over the first surface of the substrate and electrically connected to the chip through a first conductive via; and a second circuit layer, disposed over the second surface of the substrate, wherein the chip is in direct contact with the second circuit layer.

11. The substrate structure according to claim 10, wherein the chip is electrically connected to the second circuit layer through a second conductive via.

12. The substrate structure according to claim 10, further comprising:

an insulation filling structure, disposed in the through groove and located between the substrate and the chip.

13. The substrate structure according to claim 10, further comprising:

an insulation filling structure, embedded in the substrate to divide the substrate into a plurality of regions isolated from each other.

14. The substrate structure according to claim 13, wherein a part of the first circuit layer is electrically connected to the second circuit layer through a part of the substrate.

15. The substrate structure according to claim 13, further comprising:

a conductive connector, penetrating through the insulation filling structure and electrically connected to the first circuit layer and the second circuit layer.

16. The substrate structure according to claim 10, further comprising:

a first insulating layer, disposed between the first surface of the substrate and the first circuit layer.

17. The substrate structure according to claim 16, wherein the first insulating layer is filled in the through groove.

18. The substrate structure according to claim 16, further comprising:

a second insulating layer, disposed between the second surface of the substrate and the second circuit layer and in contact with the first insulating layer.

* * * * *